(12) United States Patent
Lee et al.

(10) Patent No.: US 11,989,966 B2
(45) Date of Patent: May 21, 2024

(54) SEMICONDUCTOR DEVICES AND METHODS FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Jiunn-Liang Yu, Taipei (TW); Kwang-Ming Lin, Taichung (TW); Yin Chen, Hsinchu (TW); Si-Twan Chen, Jhubei (TW); Hsueh-Jung Lin, Jhubei (TW); Wen-Chih Lu, New Taipei (TW); Chih-Hsien Chen, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 385 days.

(21) Appl. No.: 17/497,362

(22) Filed: Oct. 8, 2021

(65) Prior Publication Data
US 2022/0029035 A1 Jan. 27, 2022

Related U.S. Application Data

(62) Division of application No. 16/738,151, filed on Jan. 9, 2020, now Pat. No. 11,177,397.

(51) Int. Cl.
*G06V 40/13* (2022.01)
*H01L 31/02* (2006.01)
*H01L 31/0216* (2014.01)
*H01L 31/18* (2006.01)

(52) U.S. Cl.
CPC ........ *G06V 40/13* (2022.01); *H01L 31/02016* (2013.01); *H01L 31/02164* (2013.01); *H01L 31/18* (2013.01)

(58) Field of Classification Search
CPC .............. G06V 40/13; H01L 31/02016; H01L 31/02164; H01L 31/18
See application file for complete search history.

(56) References Cited

U.S. PATENT DOCUMENTS

| 2009/0128004 A1 | 5/2009 | Chao et al. |
| 2016/0097681 A1* | 4/2016 | Buchan ................... G01J 5/045 250/338.4 |
| 2017/0309497 A1 | 10/2017 | Dieny et al. |
| 2018/0066982 A1 | 3/2018 | Peng et al. |

(Continued)

*Primary Examiner* — S M Sohel Imtiaz
(74) *Attorney, Agent, or Firm* — Birch, Stewart, Kolasch & Birch, LLP

(57) ABSTRACT

A method for forming semiconductor devices includes providing a substrate with a conductive pad formed thereon; forming a transparent structure over the substrate, wherein the transparent structure includes a plurality of collimating pillars adjacent to the conductive pad; forming a light-shielding structure over the plurality of collimating pillars and the conductive pad; performing a cutting process to remove one or more materials directly above the conductive pad, while leaving remaining material to cover the conductive pad, wherein the material includes a portion of the light-shielding structure; and performing an etching process to remove the remaining material to expose the conductive pad.

19 Claims, 15 Drawing Sheets

(56) References Cited

U.S. PATENT DOCUMENTS

| | | | |
|---|---|---|---|
| 2018/0335568 A1 | 11/2018 | Hassan et al. | |
| 2019/0267417 A1* | 8/2019 | Peng | H01L 27/14623 |
| 2020/0194614 A1* | 6/2020 | Pares | H01L 31/1892 |
| 2020/0387686 A1* | 12/2020 | Jhang | G06F 3/0421 |
| 2021/0091251 A1* | 3/2021 | Onal | H01L 31/107 |
| 2022/0123036 A1* | 4/2022 | Kim | H01L 27/14685 |
| 2023/0092567 A1* | 3/2023 | Jhang | G02B 27/30 |
| | | | 455/557 |

* cited by examiner

SEMICONDUCTOR DEVICES AND METHODS FOR FORMING THE SAME

CROSS REFERENCE TO RELATED APPLICATIONS

This application is a Divisional Application of U.S. patent application Ser. No. 16/738,151, filed on Jan. 9, 2020, the entirety of which is incorporated by reference herein.

BACKGROUND

Technical Field

The embodiments of the present disclosure relate to semiconductor manufacturing, and in particular to semiconductor devices with collimating pillars and methods for forming the same.

Description of the Related Art

A semiconductor device includes a substrate and a circuit component disposed over the substrate. Such semiconductor devices have been widely used in various electronic products, such as personal computers, mobile phones, digital cameras, and other electronic devices. The evolution of semiconductor devices continues to influence and improve the way people live.

With the development of technology, disposing biometric devices in electronic products has become a trend. These biometric devices can be used to identify biological features, such as a face, a voice, an iris, a retina, veins or fingerprints. Fingerprint identification technology has become one of the most common biometric methods because of its convenience and uniqueness.

However, although the manufacturing method of the existing fingerprint identification device generally meets requirements, it is not satisfactory in every respect, and further improvements are needed to improve the yield and the reliability of the product.

BRIEF SUMMARY

In accordance with some embodiments of the present disclosure, a method for forming a semiconductor device is provided. The method includes providing a substrate with a conductive pad formed thereon; forming a transparent structure over the substrate, wherein the transparent structure includes a plurality of collimating pillars adjacent to the conductive pad; forming a light-shielding structure over the plurality of collimating pillars and the conductive pad; performing a cutting process to remove one or more materials directly above the conductive pad, while leaving the remaining material covering the conductive pad, wherein the material includes a portion of the light-shielding structure; and performing an etching process to remove the remaining material to expose the conductive pad.

In some embodiments, the thickness of the remaining material is in a range from 10 μm to 60 μm.

In some embodiments, the remaining material is a light-shielding structure.

In some embodiments, the transparent structure further includes a bulk portion directly above the conductive pad, and removing the material further includes removing a portion of the bulk portion.

In some embodiments, the remaining material is another portion of the bulk portion.

In some embodiments, the method further includes forming a protective layer over the conductive pad before forming the transparent structure, and after forming the transparent structure, the bulk portion of the transparent structure covers the protective layer.

In some embodiments, the remaining material is the protective layer.

In some embodiments, the substrate has a scribe line, and the sidewall of the protective layer is aligned with the scribe line.

In some embodiments, the bulk portion covers a top surface and the sidewall of the protective layer so that the protective layer is spaced apart from the light-shielding structure.

In some embodiments, the protective layer includes wax, hydrogel, photoresist material, or a combination thereof.

In some embodiments, after the cutting process, the light-shielding structure has a stepped sidewall, and the stepped sidewall is adjacent to the conductive pad, wherein the stepped sidewall has an upper sidewall and a lower sidewall.

In some embodiments, the distance between the upper sidewall of the stepped sidewall and one of the collimating pillars is greater than the distance between the lower sidewall of the stepped sidewall and the collimating pillar.

In some embodiments, the distance between the upper sidewall of the stepped sidewall and one of the collimating pillars is less than the distance between the lower sidewall of the stepped sidewall and the collimating pillar.

In some embodiments, the method further includes forming a protective layer over the conductive pad before forming the light-shielding structure, and the remaining material is the protective layer.

In accordance with some embodiments of the present disclosure, a semiconductor device is provided. The semiconductor device includes a conductive pad disposed on a substrate; a plurality of transparent collimating pillars disposed on the substrate and adjacent to the conductive pad; and a light-shielding structure disposed between the plurality of transparent collimating pillars and between the plurality of transparent collimating pillars and the conductive pad, and the light-shielding structure has a stepped sidewall adjacent to the conductive pad, wherein the stepped sidewall has an upper sidewall away from the substrate and a lower sidewall adjacent to the substrate.

In some embodiments, the distance between the upper sidewall of the stepped sidewall and one of the transparent collimating pillars is greater than the distance between the lower sidewall of the stepped sidewall and the transparent collimating pillar.

In some embodiments, the distance between the upper sidewall of the stepped sidewall and one of the transparent collimating pillars is less than the distance between the lower sidewall of the stepped sidewall and the transparent collimating pillar.

In some embodiments, the length of the lower sidewall of the stepped sidewall is less than the height of any one of the transparent collimating pillars.

In some embodiments, the plurality of transparent collimating pillars include a light-curable material, a thermoset material, or a combination thereof.

In some embodiments, the height of one of the transparent collimating pillars is in a range from 10 μm to 500 μm.

BRIEF DESCRIPTION OF THE DRAWINGS

The disclosure can be more fully understood from the following detailed description when read with the accompanying figures. It is worth noting that, in accordance with standard practice in the industry, various features are not drawn to scale and are for illustrative purposes only. In fact, the dimensions of the various features may be arbitrarily increased or reduced for clarity of the features of the present disclosure.

DETAILED DESCRIPTION

Figure 1A:
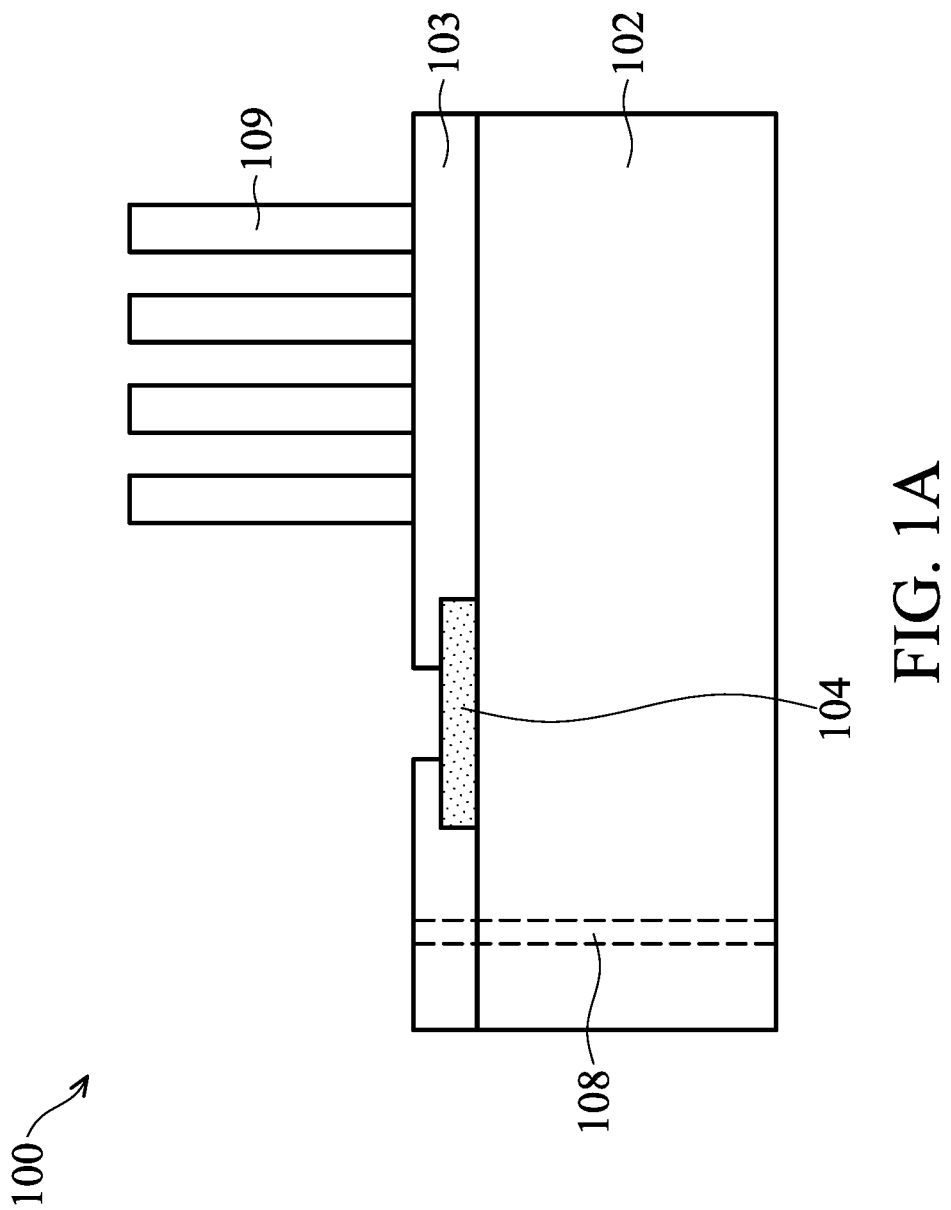
FIGS. 1A-1D are cross-sectional views illustrating a semiconductor device at various stages of manufacture in accordance with some embodiments.

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the sequences of processes and/or including more or fewer steps than described herein.

Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact, and spatially relative descriptors of the first element and the second element may change as the device is operated or used in different orientations. In addition, the present disclosure may repeat reference numerals and/or letters in the various examples. This repetition is for the purpose of simplicity and clarity and does not in itself dictate a relationship between the various embodiments and/or configurations discussed.

Hereinafter, semiconductor devices and methods of forming the same are described in accordance with some embodiments of the present disclosure, and are particularly applicable to semiconductor devices having collimating pillars. The manufacturing method for the semiconductor device provided by the present disclosure can protect the conductive pad during the cutting process to avoid damage of the conductive pad, and can remove the material remaining on the surface of the conductive pad, thereby avoiding affecting the electrical connection, thereby improving the yield of the semiconductor device.

FIGS. 1A-1D are cross-sectional views illustrating a semiconductor device 100 at various stages of manufacture in accordance with some embodiments. The method for forming the semiconductor device 100 of the present disclosure is suitable for forming a substrate 102 having a conductive pad 104, such as a silicon wafer, and any desired semiconductor component may be formed thereon, such as a Metal-Oxide-Semiconductor Field-Effect Transistor (MOSFET), resistor, logic element, or the like, but for simplicity, it is only represented by a flat substrate 102. In the description of the present disclosure, the term "substrate" includes components formed on a semiconductor wafer and various coatings overlying the wafer.

As illustrated in FIG. 1A, the semiconductor device 100 includes the substrate 102. The substrate 102 may use any substrate material suitable for the semiconductor device 100. For example, the substrate 102 may be a bulk semiconductor substrate or a composite substrate formed of different materials, and the substrate 102 may be doped (such as using p-type dopants or n-type dopants) or undoped. In some embodiments, the substrate 102 may include an elemental semiconductor substrate, a compound semiconductor substrate, or an alloy semiconductor substrate. For example, the substrate 102 may include a silicon substrate, a germanium substrate, a silicon-germanium substrate, a silicon carbide (SiC) substrate, an aluminum nitride (AlN) substrate, an aluminum oxide ($Al_2O_3$) substrate, a gallium nitride (GaN) substrate, the like, or a combination thereof. In some embodiments, the substrate 102 may include an insulator-on-insulator (SOI) substrate formed by disposing a semiconductor material over an insulating layer.

As illustrated in FIG. 1A, the scribe line 108 is illustrated with dashed lines. In a subsequent process, the substrate is diced along the scribe line 108 to the desired size and shape.

According to some embodiments, as illustrated in FIG. 1A, the substrate 102 has a conductive pad 104 disposed thereon, and the conductive pad 104 is used to electrically connect the components within the substrate 102 to outside. In some embodiments, the conductive pad 104 may be formed by depositing a conductive material over the substrate 102 and then performing a patterning process on the deposited conductive material to form the conductive pad 104 having the desired shape over the substrate 102.

In some embodiments, depositing the conductive material may include a physical vapor deposition (PVD) process, a chemical vapor deposition (CVD) process, a plating process, the like, or a combination thereof. In some embodiments, the conductive material may include metal, metal silicide, a semiconductor material, the like, or a combination thereof. For example, metal may be gold (Au), nickel (Ni), platinum (Pt), palladium (Pd), iridium (Ir), titanium (Ti), chromium (Cr), tungsten (W), aluminum (Al), copper (Cu), the like, an alloy thereof, a multilayer thereof, or a combination thereof, and the semiconductor material may include poly-Si, poly-Ge, poly-SiGe, the like, or a combination thereof.

In some embodiments, the patterning process of the conductive material may include forming a mask layer (not illustrated). In some embodiments, the mask layer may include a photoresist, such as a positive photoresist or a negative photoresist. In other embodiments, the mask layer may include a hard mask, such as silicon oxide ($SiO_2$), silicon nitride (SiN), silicon oxynitride (SiON), silicon carbide (SiC), silicon carbonitride (SiCN), the like, or a combination thereof. In some embodiments, the mask layer may be formed by spin-on coating, CVD, atomic layer deposition (ALD), the like, or a combination thereof. One or more mask layers may be formed. Then, the mask layer may be patterned by a suitable process, such as a photolithography process. For example, the photolithography process may include mask aligning, exposure, post-exposure baking (PEB), developing, other suitable processes, or a combination thereof.

Then, the conductive material may be etched by an etching process with a patterned mask layer. In some embodiments, the etching process may include a dry etching process, a wet etching process, or a combination thereof. For example, the etching process may include reactive ion etching (RIE), inductively-coupled plasma (ICP) etching, neutral beam etching (NBE), electron cyclotron resonance (ERC) etching, the like, or a combination thereof.

Then, an insulating material 103 may be formed over the conductive pad 104 to protect the conductive pad 104 from damage which may be caused during subsequent processing, in accordance with some embodiments. In some embodiments, the insulating material 103 may include a dielectric material, such as silicon oxide, silicon nitride, silicon oxynitride, a low-k dielectric material, the like, or a combination thereof. The insulating material 103 may be formed by a deposition process, such as a CVD process, an ALD process, a spin-on coating process, a flowable chemical vapor deposition (FCVD), the like, or a combination thereof.

Then, the insulating material 103 may be thinned or planarized by, for example, a chemical mechanical polishing (CMP) process to form an insulating material 103 having the desired thickness and a top surface, in accordance with some embodiments. Then, an opening of the insulating material 103 may be etched to expose the underlying conductive pad 104. In some embodiments, etching the insulating material 103 may include forming a patterned mask layer (not illustrated) over the insulating material 103, and then etching a portion of the insulating material 103 exposed by the patterned mask layer to remove the portion of the insulating material 103. The examples of materials and formation methods of the patterned mask layer and the etching process are as described above, and will not be described again. In some embodiments, the ratio of the width of the opening to the width of the conductive pad 104 is in a range from about 1:1 to about 1:2, such as about 1:1.

The insulating material 103 covers the top surface of the conductive pad 104 in FIG. 1A, but the present disclosure is not limited thereto. For example, the top surface of the insulating material 103 may be substantially coplanar with the top surface of the conductive pad 104 by a thinning process to expose the top surface of the entire conductive pad 104. Furthermore, the insulating material 103 is optional. In some embodiments, the insulating material 103 may not be formed and the top surface and the sidewall of the conductive pad 104 may be exposed.

Then, a transparent structure is formed over the substrate 102, in accordance with some embodiments, wherein the transparent structure includes a plurality of transparent collimating pillars 109 adjacent to the conductive pad 104, the plurality of transparent collimating pillars 109 respectively corresponding to a plurality of pixels (not illustrated) underneath to protect the plurality of pixels from being damaged by subsequent processes. The transparent collimating pillars 109 may also be referred to simply as a collimating pillar.

In some embodiments, the transparent collimating pillar 109 may include a transparent material, such as glass or a transparent resin, which may have a light transmittance of greater than about 70% at a wavelength of from about 200 nanometers (nm) to about 1200 nm, for example, has a light transmission of greater than about 90% at a wavelength of from about 300 nm to about 1100 nm. The transparent collimating pillars 109 may include a light-curable material, a thermoset material, or a combination thereof. For example, the transparent collimating pillars 109 may include poly (methyl methacrylate) (PMMA), polyethylene terephthalate (PET), polyethylene naphthalate (PEN), polycarbonate (PC), perfluorocyclobutyl (PFCB) polymer, polyimide (PI), acrylic resin, epoxy resin, polypropylene (PP), polyethylene (PE), polystyrene (PS), polyvinyl chloride (PVC), other suitable materials, or a combination thereof.

In some embodiments, the transparent collimating pillar 109 may be formed by a spin-on coating process, casting, bar coating, blade coating, roller coating, wire bar coating, dip coating, CVD process, other suitable processes, or a combination thereof.

Then, the material of the transparent collimating pillars 109 may be patterned by a suitable process to form the desired shape. In some embodiments, the transparent collimating pillars 109 may include a circle, a rectangle, a polygon, the like, or a combination thereof from a top view, and may be arranged in an array.

In some embodiments, the height of one of the transparent collimating pillar 109 may be in a range from about 10 micrometers (μm) to about 500 μm, or may be in a range from about 50 μm to about 300 μm, such as about 60 μm to about 100 μm. Top surfaces of the transparent collimating pillars 109 are generally aligned with one another. In some embodiments, an aspect ratio of one of the transparent collimating pillars 109 is in a range from about 2 to about 30, such as from about 5, about 10, about 15, or about 20. Within this aspect ratio range, the possibility of deformation or collapse of the transparent collimating pillars 109 can be reduced, and the semiconductor device 100 can have better sensitivity.

Figure 1B:
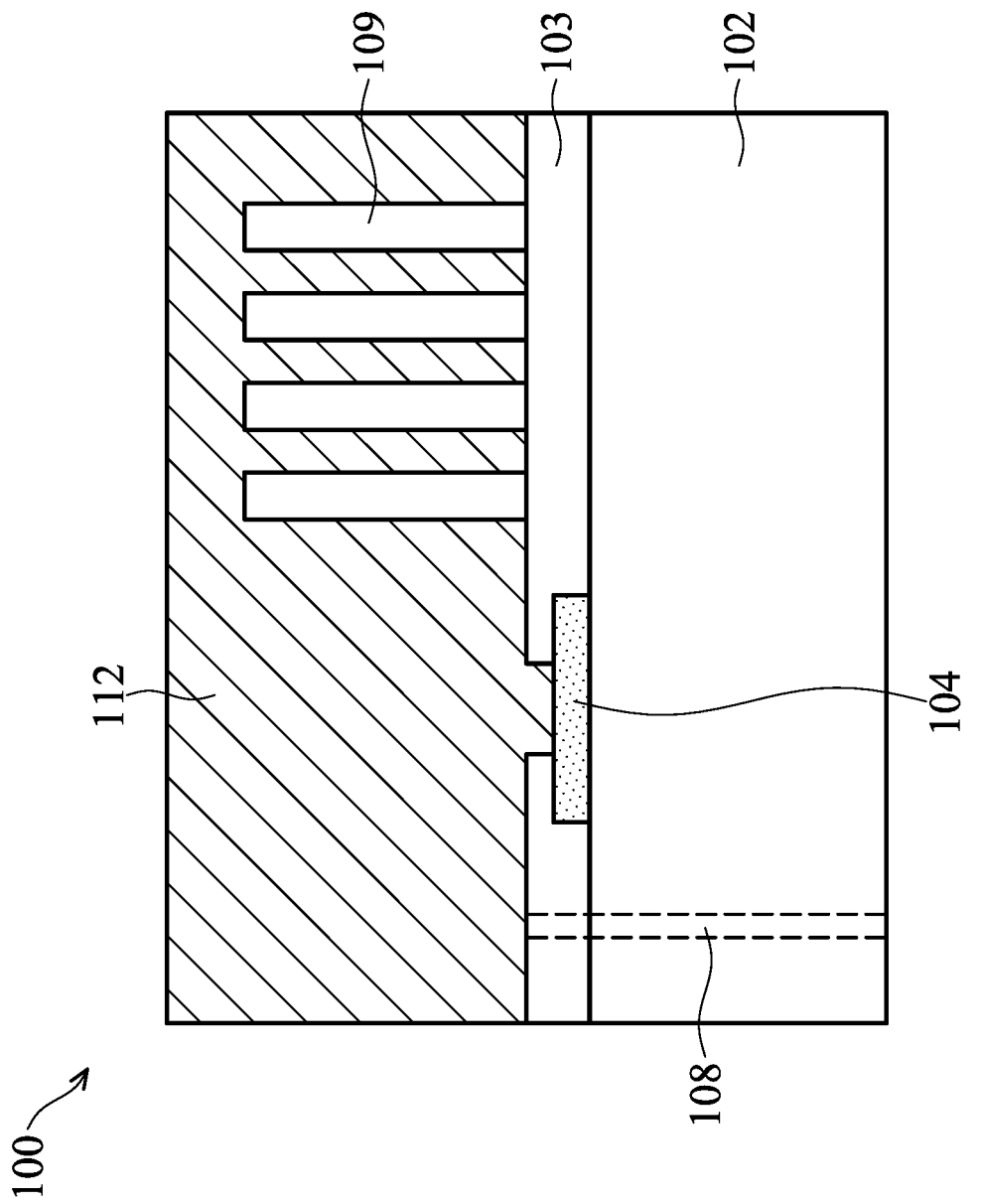

Then, as illustrated in FIG. 1B, a light-shielding structure 112 is formed over the transparent collimating pillars 109 and the conductive pad 104, and the light-shielding structure 112 is located between the transparent collimating pillars 109 to make the light accurately reach pixels corresponding to the respective transparent collimating pillar 109, in accordance with some embodiments.

In some embodiments, the light-shielding structure 112 may include a light-shielding material, such as a resin light-shielding material, which has a light transmittance of less than about 1% at a wavelength of from about 200 nm to about 1200 nm, such as the light transmittance of less than about 0.8% at a wavelength of from 300 nm to about 1100 nm. In some embodiments, the light-shielding structure 112 may include a photoresist material (such as black photoresist), an ink (such as black ink), a molding compound (such as black molding compound), a solder mask (such as black solder material), an epoxy black polymer material, other suitable materials, or a combination thereof. In some embodiments, the light-shielding structure 112 may include a light-curable material, a thermoset material, or a combination thereof.

Figure 1C:
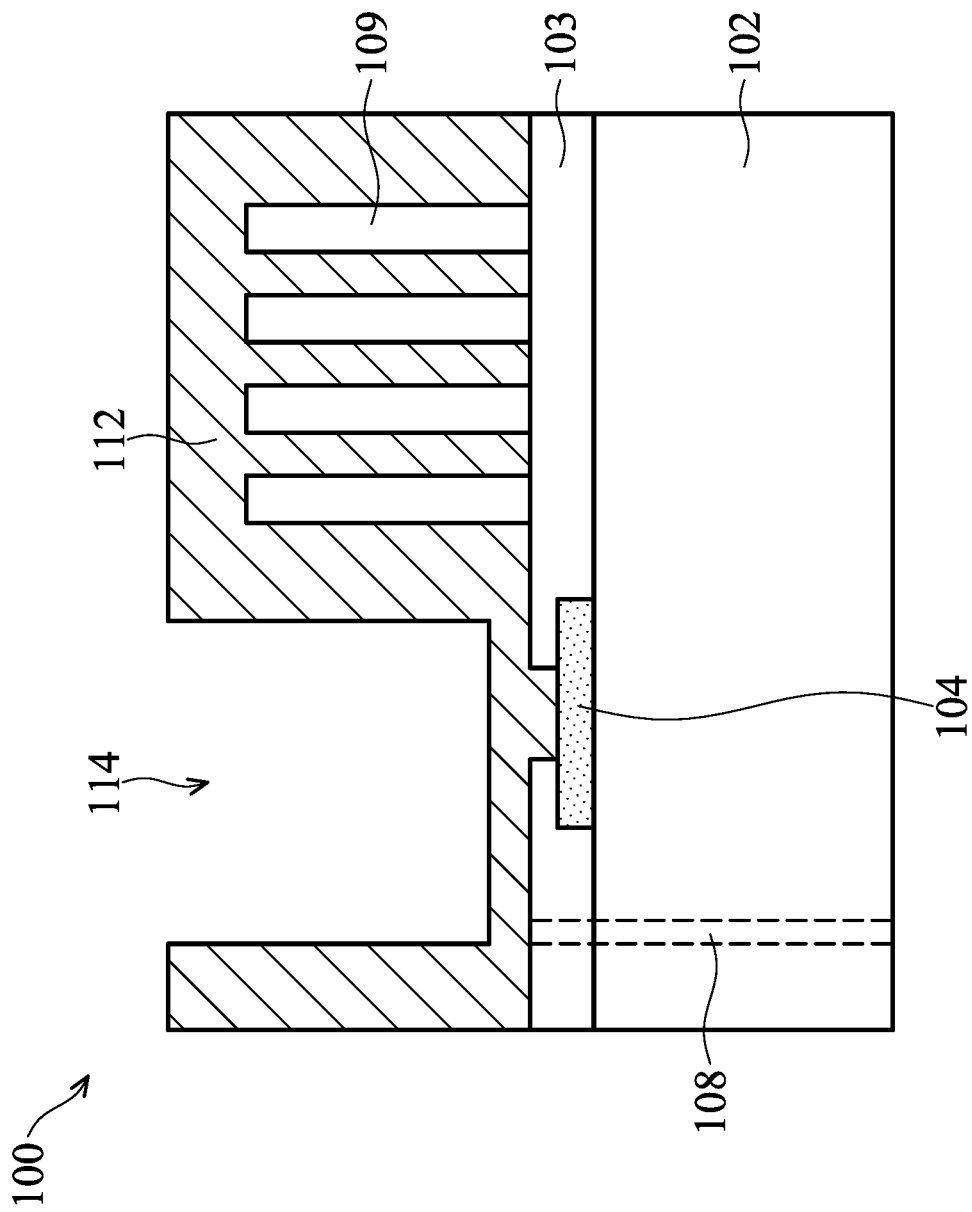

Then, in accordance with some embodiments, as illustrated in FIG. 1C, a cutting process is performed on the light-shielding structure 112 to remove a portion of the light-shielding structure 112 located directly above the conductive pad 104, and remaining another portion of the light-shielding structure 112 covering the conductive pad 104. In some embodiments, the cutting process may include laser cutting, ion beam cutting, wire saw, any suitable cutting technique, or a combination thereof.

An opening 114 is formed after the cutting process. In FIG. 1C, the opening 114 has a substantially vertical sidewall and a substantially flat bottom surface, but the present disclosure is not limited thereto. For example, the opening 114 may have a sloped sidewall, a concave bottom surface, or another shape.

Figure 1D:
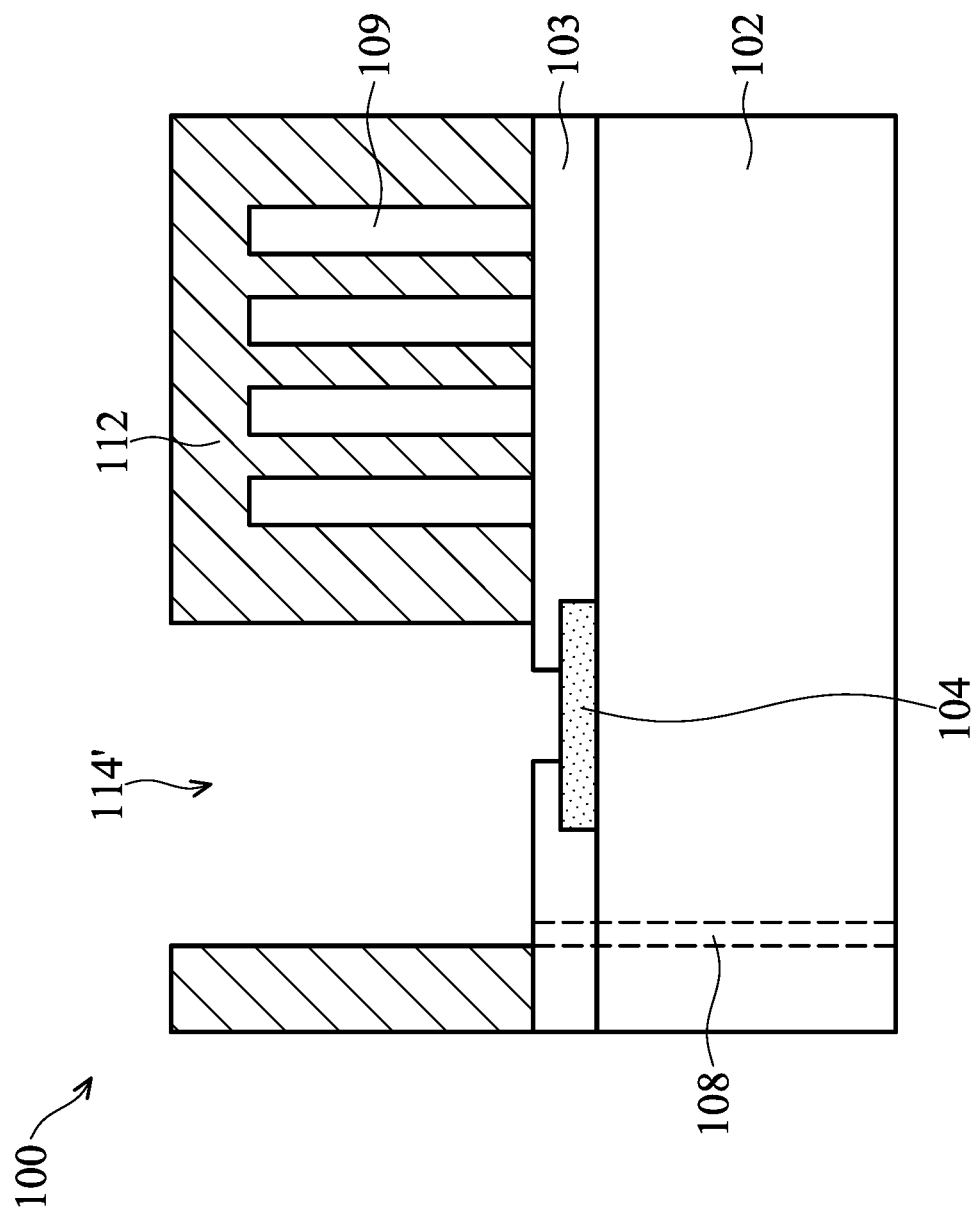

Then, as illustrated in FIG. 1D, an etching process is performed on the remaining portion of the light-shielding structure 112 directly above the conductive pad 104 via the opening 114 to form an opening 114' and expose the conductive pad 104. In some embodiments, the etching process may include a dry etching process, a wet etching process, or a combination thereof. For example, the dry etching process may include RIE, ICP etching, NBE, ERC etching, the like, or a combination thereof. For example, the wet etching process may use, for example, hydrofluoric acid (HF), ammonium hydroxide (NH$_4$OH), any suitable etchant, or a combination thereof. In some embodiments, the light-shielding structure 112 includes an epoxy resin which may be etched by a dry etching process.

In accordance with some embodiments, using the etching process to remove the material directly above the conductive pad 104 does not cause damage to the conductive pad 104 as compared to the embodiments which use only a cutting process to remove the material directly above the conductive pad 104. On the other hand, in order to avoid damage to the conductive pad 104 by the cutting process, the embodiments using only the cutting process may leave material on the conductive pad 104, while the etching process may completely remove the remaining material since the etching process does not damage the conductive pad 104, thereby improving the reliability of the semiconductor device 100.

The opening 114' is formed after the etching process. In some embodiments, the opening 114' exposes the scribe line 108 to facilitate the dicing process along the scribe line 108 during subsequent processing of dicing the substrate 102 to increase the yield of the semiconductor device 100. The opening 114' has a substantially vertical sidewall in FIG. 1D, but the present disclosure is not limited thereto. For example, the opening 114' may have a sloped sidewall or another shape.

In the above embodiment, the cutting process and the etching process are performed on the light-shielding material 112 directly above the conductive pad 104, wherein the cutting process can quickly remove a portion of the main portion of the light-shielding material 112 on the conductive pad 104, and then an etching process can completely remove the remaining portion of the light-shielding material 112 on the conductive pad 104 to expose the conductive pad 104. The remaining portion can protect the conductive pad 104 from being damaged during the cutting process. The etching process can remove the light-shielding material 112 remaining on the conductive pad 104 without damaging the surface of the conductive pad 104. The thickness of the remaining portion may be in a range from about 10 μm to about 60 μm, such as from about 15 μm to about 25 μm. Within this thickness range, the remaining portion has sufficient thickness to effectively protect the conductive pad 104 during the cutting process, while not taking too much time for the etching process since the thickness is too thick. In some embodiments, the ratio of the thickness of the portion removed by the cutting process to the thickness of the portion removed by the etching process is from about 10:1 to about 2:1.

FIGS. 2A-2D are cross-sectional views illustrating a semiconductor device 200 at various stages of manufacture in accordance with other embodiments. FIGS. 2A-2D and FIGS. 1A-1D describe the same elements with the same reference numerals, the materials and formation methods of these elements are as described above, and will not be described again. Compared to the embodiments of FIGS. 1A-1D, the following embodiments will add additional components, such as a bulk portion 110, which use materials that are easier to etch, to reduce processing time.

Figure 2A:
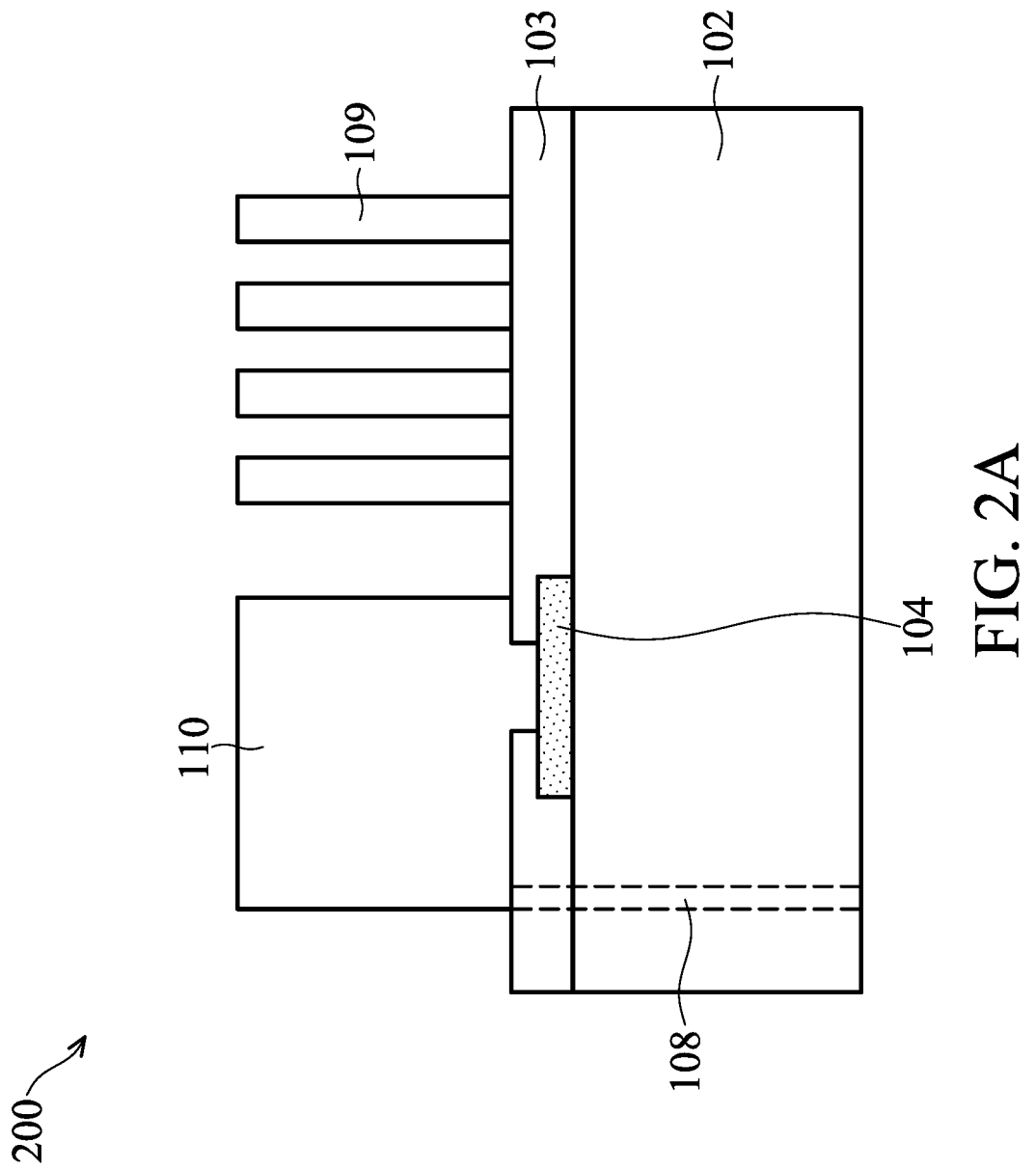
FIGS. 2A-2D are cross-sectional views illustrating a semiconductor device at various stages of manufacture in accordance with other embodiments.

As illustrated in FIG. 2A, the semiconductor device 200 is further provided with the bulk portion 110 over the conductive pad 104. In some embodiments, the material and formation of the bulk portion 110 may be selected from the material and formation of the transparent collimating pillars 109, and the bulk portion 110 may be formed in the same step as the transparent collimating pillar 109, but the present disclosure is not limited thereto. For example, the bulk portion 110 may use a different material and/or formation than the transparent collimating pillars 109. In this case, the bulk portion 110 and the transparent collimating pillars 109 may have different heights, and the bulk portion 110 may formed before, during or after the transparent collimating pillars 109. In some embodiments, the material of the bulk portion 110 may be different than the material of the transparent collimation pillars 109, for example, the material of the bulk portion 110 is a photoresist material, and the material of the transparent collimating pillars 109 is a transparent resin.

In some embodiments, the bulk portion 110 covers the scribe line 108, and the sidewall of the bulk portion 110 may be substantially aligned with the scribe line 108, but the present disclosure is not limited thereto. For example, the sidewall of the bulk portion 110 may be outside or inside the scribe line 108.

Figure 2B:
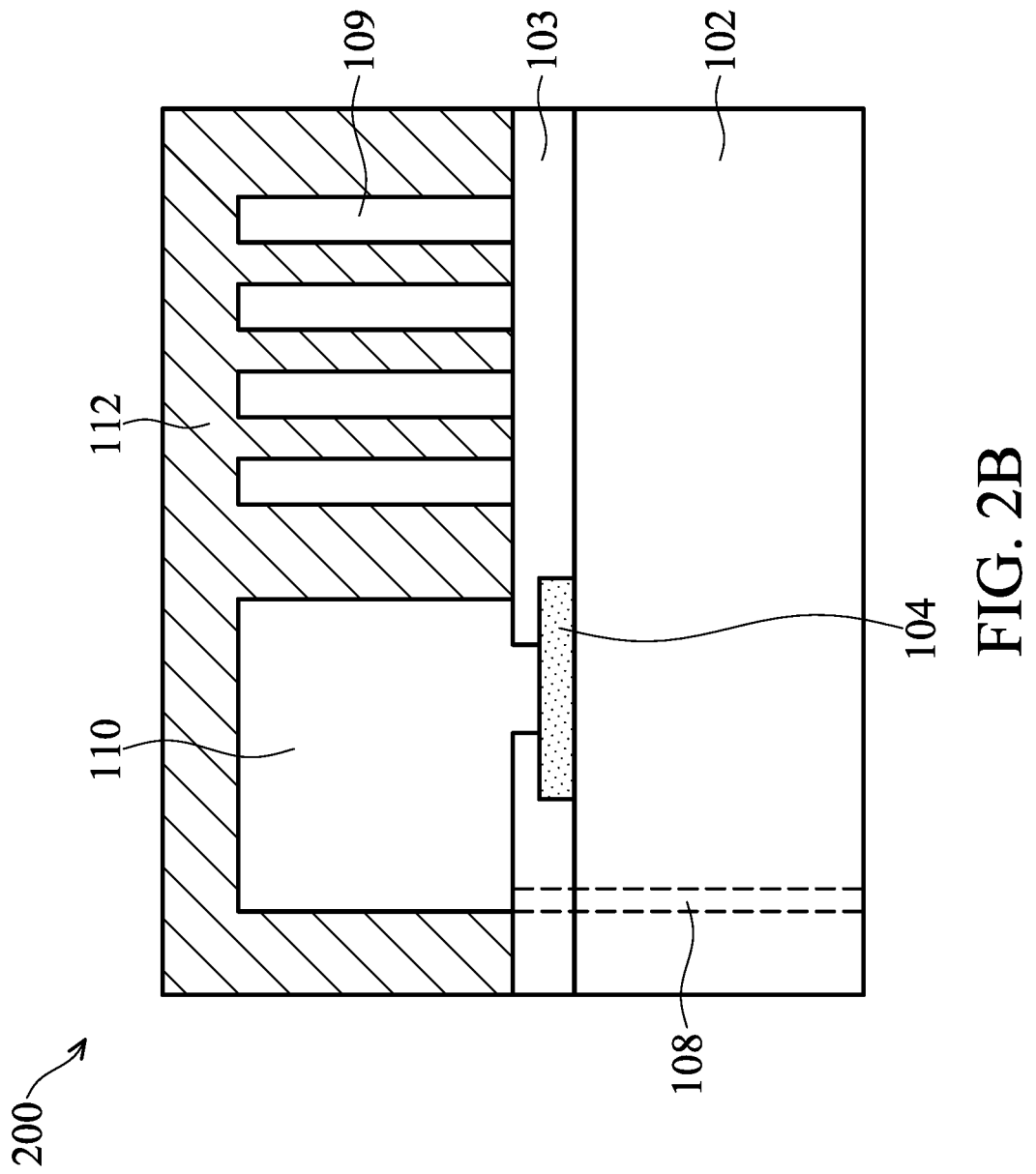

Then, as illustrated in FIG. 2B, the light-shielding structure 112 is formed over the bulk portion 110 and the transparent collimating pillars 109, in accordance with some embodiments, wherein the light-shielding structure 112 is formed between the transparent collimating pillars 109 and between the bulk portion 110 and the transparent collimating pillars 109. Examples of the material and formation of the light-shielding structure 112 are as described above, and will not be described again.

Figure 2C:
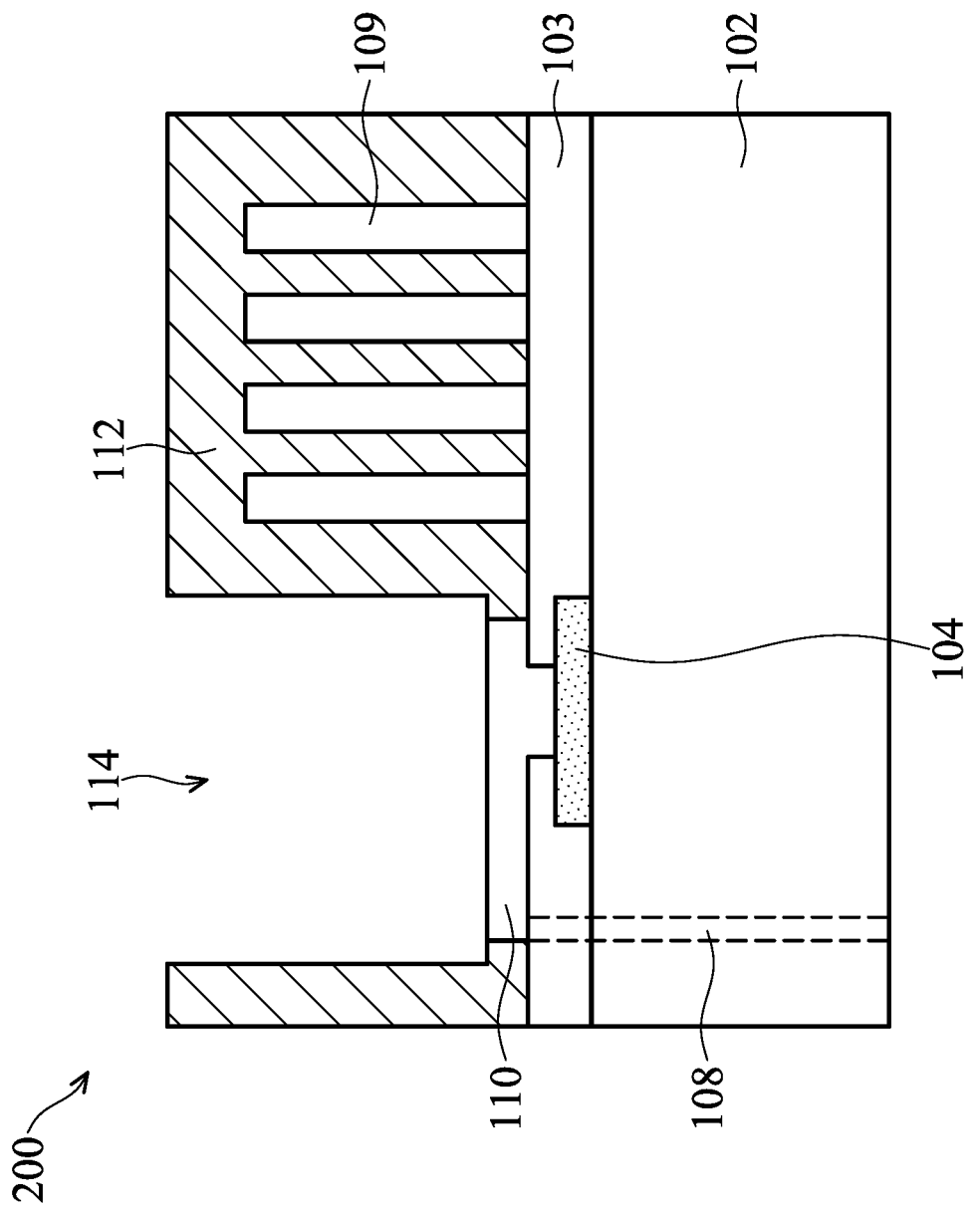

Then, in accordance with some embodiments, as illustrated in FIG. 2C, a cutting process is performed on the light-shielding structure 112 and the bulk portion 110 to remove a portion of the light-shielding structure 112 and a portion of the bulk portion 110 directly above the conductive pad 104, and another portion of the bulk portion 110 covering the conductive pad 104 is left. In some embodiments, the cutting process may include laser cutting, ion beam cutting, wire cutting, any suitable cutting technique, or a combination thereof.

The opening 114 is formed after the cutting process. In FIG. 1C, the opening 114 has a substantially vertical sidewall and a substantially flat bottom surface, and both sidewalls of the opening 114 are located outside sidewalls of the bulk portion 110, but the present disclosure is not limited thereto. For example, the opening 114 may have a sloped sidewall, a concave bottom surface, or another shape.

Figure 2D:
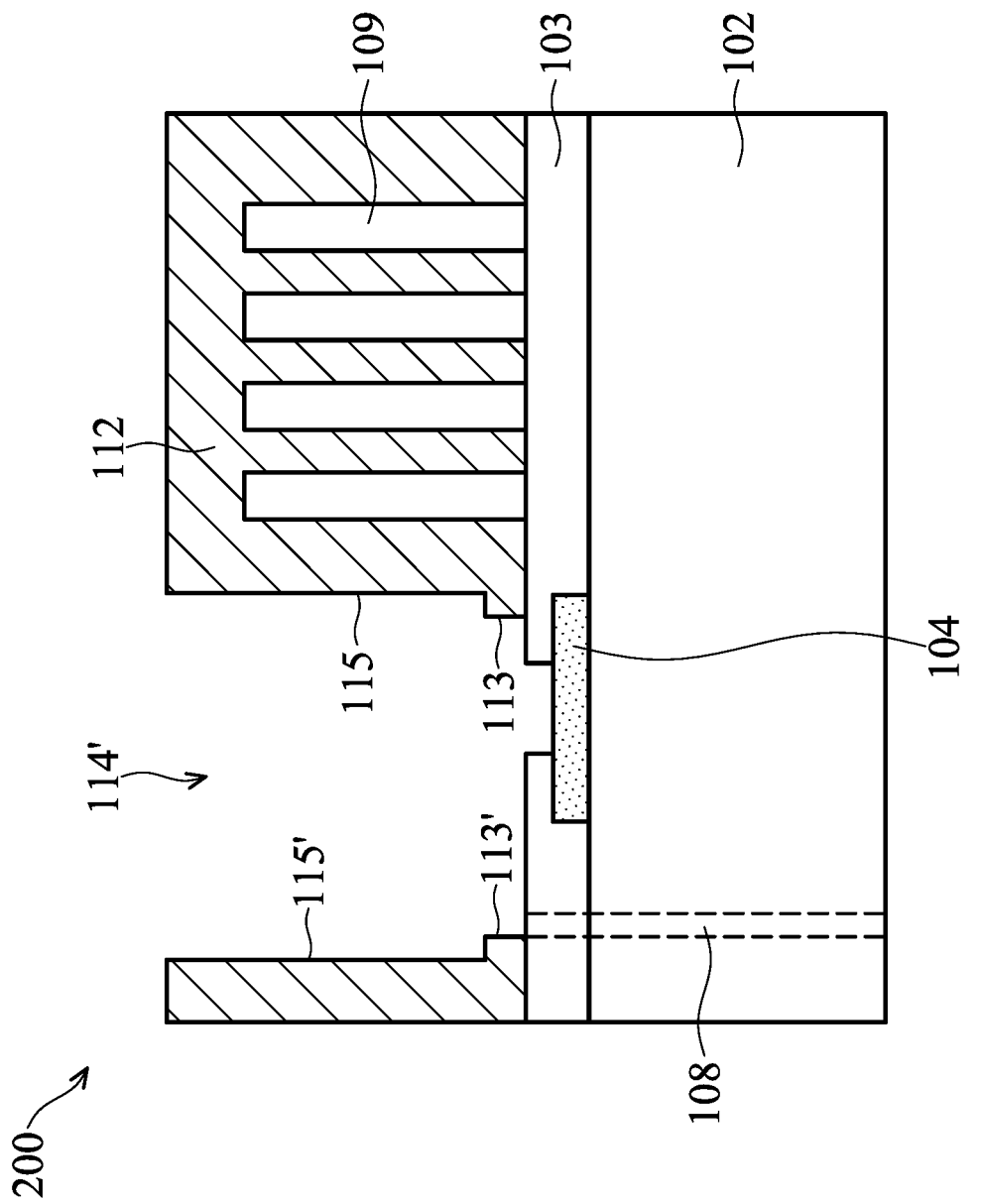

Then, as illustrated in FIG. 2D, an etching process is performed on the remaining portion of the bulk portion 110 through the opening 114 to form the opening 114' and expose the conductive pad 104, in accordance with some embodiments. In some embodiments, the etching process may include a dry etching process, a wet etching process, or a combination thereof. For example, the dry etching process may include RIE, ICP etching, NBE, ERC etching, the like, or a combination thereof. For example, the wet etching process may use, for example, HF, NH$_4$OH, any suitable etchant, or a combination thereof. In some embodiments, the bulk portion 110 includes an epoxy resin which may be etched by a wet etching process.

The light-shielding structure 112 has a stepped sidewall adjacent to the conductive pad 104, wherein the stepped sidewall has upper sidewalls 115 and 115' away from the substrate 102 and lower sidewalls 113 and 113' adjacent to the substrate 102. As illustrated in FIG. 2D, the distance between the upper sidewall 115 of the stepped sidewall and one of the transparent collimating pillars 109 is smaller than the distance between the lower sidewall 113 of the stepped sidewall and the transparent collimating pillar 109, but the present disclosure is not limited thereto. For example, the distance between the upper sidewall 115 of the stepped sidewall and one of the transparent collimating pillars 109 may be greater than or substantially equal to the distance between the lower sidewall 113 of the stepped sidewall and the transparent collimating pillar 109.

The opening 114' is formed after the remaining portion of the bulk portion 110 is removed, which exposes the scribe line 108. According to some embodiments, the bulk portion 110 may cover the scribe line 108, and after the bulk portion 110 is removed, the scribe line 108 may be exposed to accurately perform a dicing process along the scribe line 108, thereby increasing the yield of the semiconductor device 200. As illustrated in FIGS. 2A-2C, the sidewall of the bulk portion 110 is substantially aligned with the scribe line 108 so that the lower sidewall 113' of the stepped sidewall is also substantially aligned with the scribe line 108.

In the above embodiment, a cutting process and an etching process are performed on the bulk portion 110 and the light-shielding material 112 directly above the conductive pad 104, wherein the cutting process can quickly remove a portion of the bulk portion 110 and a portion of the light-shielding material 112. Then, the etching process can etch the remaining portion of the bulk portion 110 to expose the conductive pad 104. The remaining portion of the bulk portion 110 can protect the conductive pad 104 from being damaged during the cutting process. The etching process can remove the remaining portion of the bulk portion 110 without damaging the surface of the conductive pad 104. In some embodiments, the thickness of the remaining portion of the bulk portion 110 may be in a range from about 10 μm to about 60 μm, such as from about 15 μm to about 25 μm. Within this thickness range, the remaining portion of the bulk portion 110 can effectively protect the conductive pad 104 during the cutting process, while not causing the etching process to take too much time because the thickness is too thick.

In addition, the bulk portion 110 and the light-shielding structure 112 may be selected from materials having different etching rates to substantially not etch the light-shielding structure 112 during the etching of the remaining portion of the bulk portion 110, so that it is easy for the light-shielding structure 112 to have the desired sidewall shape after the etching process. In addition, the bulk portion 110 may be selected from materials that are easily etched to shorten the time required for the etching process, as compared to the material of the light-shielding structure 112.

Figure 3A:
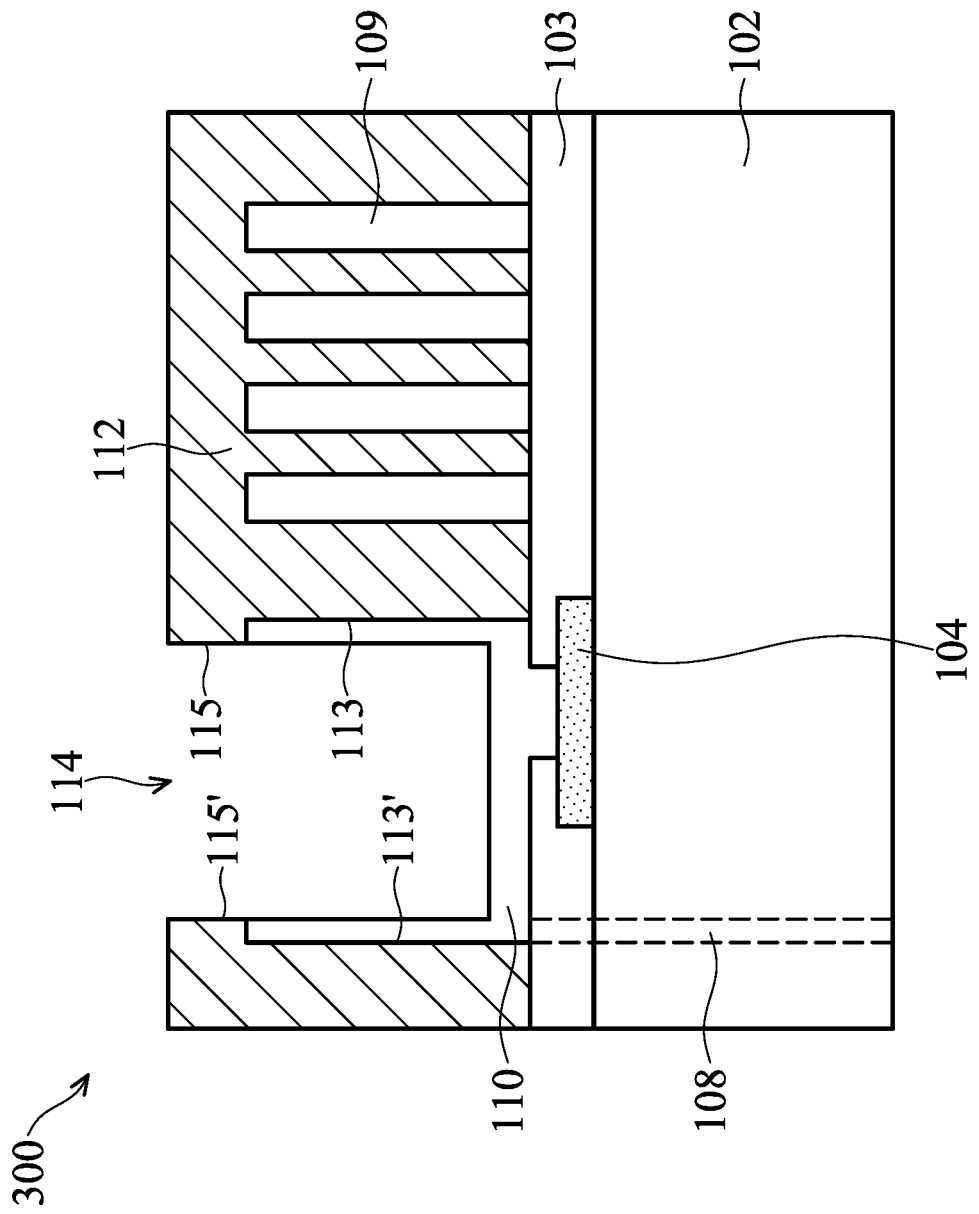
FIGS. 3A-3B are cross-sectional views illustrating a semiconductor device at various stages of manufacture in accordance with still other embodiments.
Figure 3B:
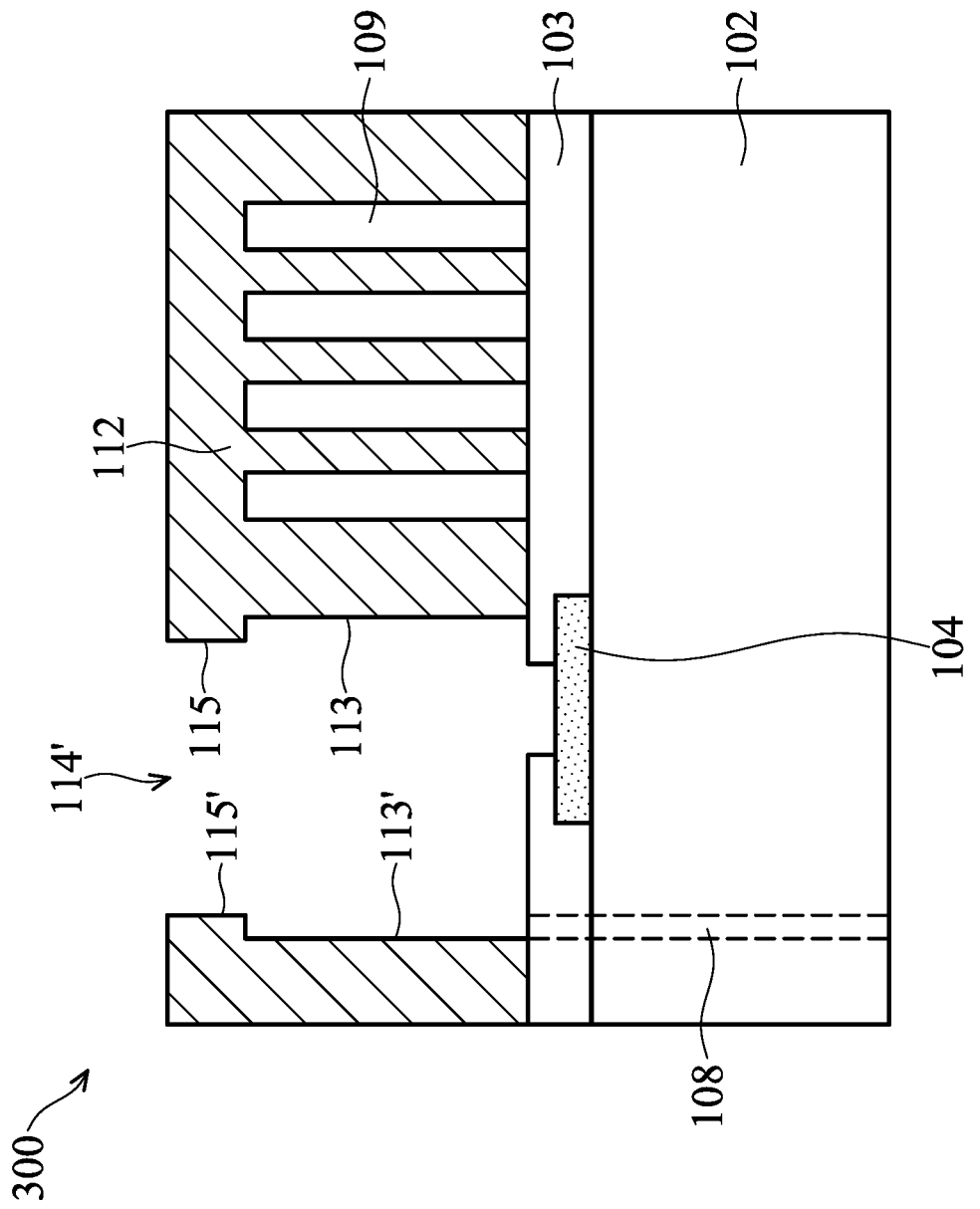

FIGS. 3A-3B are cross-sectional views illustrating a semiconductor device 300 at various stages of manufacture in accordance with still other embodiments. FIGS. 3A-3B and FIGS. 1A-1D describe the same elements with the same reference numerals, the materials and formation methods of these elements are as described above, and will not be described again.

FIG. 3A is subsequent to the step illustrated in FIG. 2B. The cutting process may be adjusted so that both sidewalls of the opening 114 can be located within the remaining portion of the bulk portion 110 and the light-shielding structure 112 can have the desired sidewall shape. As illustrated in FIG. 3A, the sidewall of the bulk portion 110 is substantially aligned with the scribe line 108, so that the lower sidewall 113' of the stepped sidewall is also substantially aligned with the scribe line 108, but the present disclosure is not limited thereto. For example, the upper sidewall 115' of the stepped sidewall may be substantially aligned with the scribe line 108.

Then, as illustrated in FIG. 3B, an etching process is performed on the remaining portion of the bulk portion 110 directly above the conductive pad 104 through the opening 114 to form the opening 114' and expose the conductive pad 104, in accordance with some embodiments. Examples of the etching process are as described above, and will not be described again. After the etching process, the light-shielding structure 112 has a stepped sidewall adjacent to the conductive pad 104, wherein the stepped sidewall have the upper sidewalls 115 and 115' away from the substrate 102 and the lower sidewalls 113 and 113' adjacent to the substrate 102. As illustrated in FIG. 3B, the distance between the upper sidewall 115 of the stepped sidewall and one of the transparent collimating pillars 109 is greater than the distance between the lower sidewall 113 of the stepped sidewall and the transparent collimating pillar 109.

FIGS. 4A-4E are cross-sectional views illustrating a semiconductor device 400 at various stages of manufacture in accordance with still other embodiments. FIGS. 4A-4E and FIGS. 1A-1D describe the same elements with the same reference numerals, the materials and formation methods of these elements are as described above, and will not be described again. Compared to the embodiments of FIGS. 1A-1D, the following embodiments will add additional components, such as a protective layer 106, which use materials that are easier to etch, to reduce processing time.

In the previous embodiment, the opening of the insulating material 103 substantially exposes a middle portion of the conductive pad 104, but the present disclosure is not limited thereto, and the positions of the conductive pad 104, the insulating material 103, and the opening of the insulating material 103 may be adjusted. In some embodiments, as illustrated in FIG. 4A, the sidewall of the opening may be substantially aligned with the sidewall of the conductive pad 104.

Figure 4A:
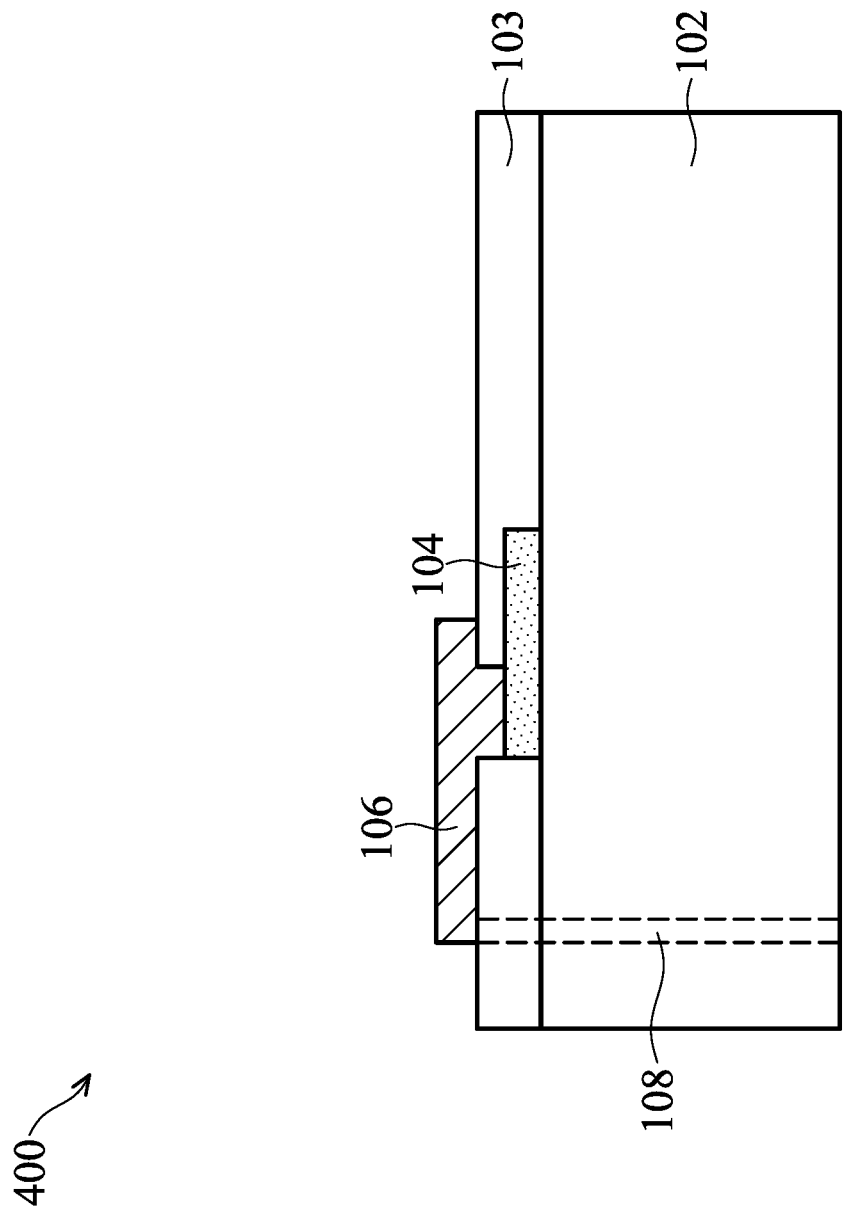
FIGS. 4A-4E are cross-sectional views illustrating a semiconductor device at various stages of manufacture in accordance with still other embodiments.

As illustrated in FIG. 4A, the protective layer 106 is formed over the conductive pad 104. In some embodiments, the protective layer 106 covers the scribe line 108, and the sidewall of the protective layer 106 is substantially aligned with the scribe line 108. The protective layer 106 may include a material having a different etching selectivity than the material of the conductive pad 104, such as a wax, hydrogel, photoresist material, the like, or a combination thereof. The protective layer 106 may be formed using any suitable process, such as a spin-on coating process. In some embodiments, the thickness of the protective layer 106 may be in a range from about 10 μm to about 60 μm, such as from about 15 μm to about 25 μm. Within this thickness range, the protective layer 106 may effectively protect the conductive pad 104 during the cutting process, while not causing the etching process to take too much time because the thickness is too thick.

Figure 4B:
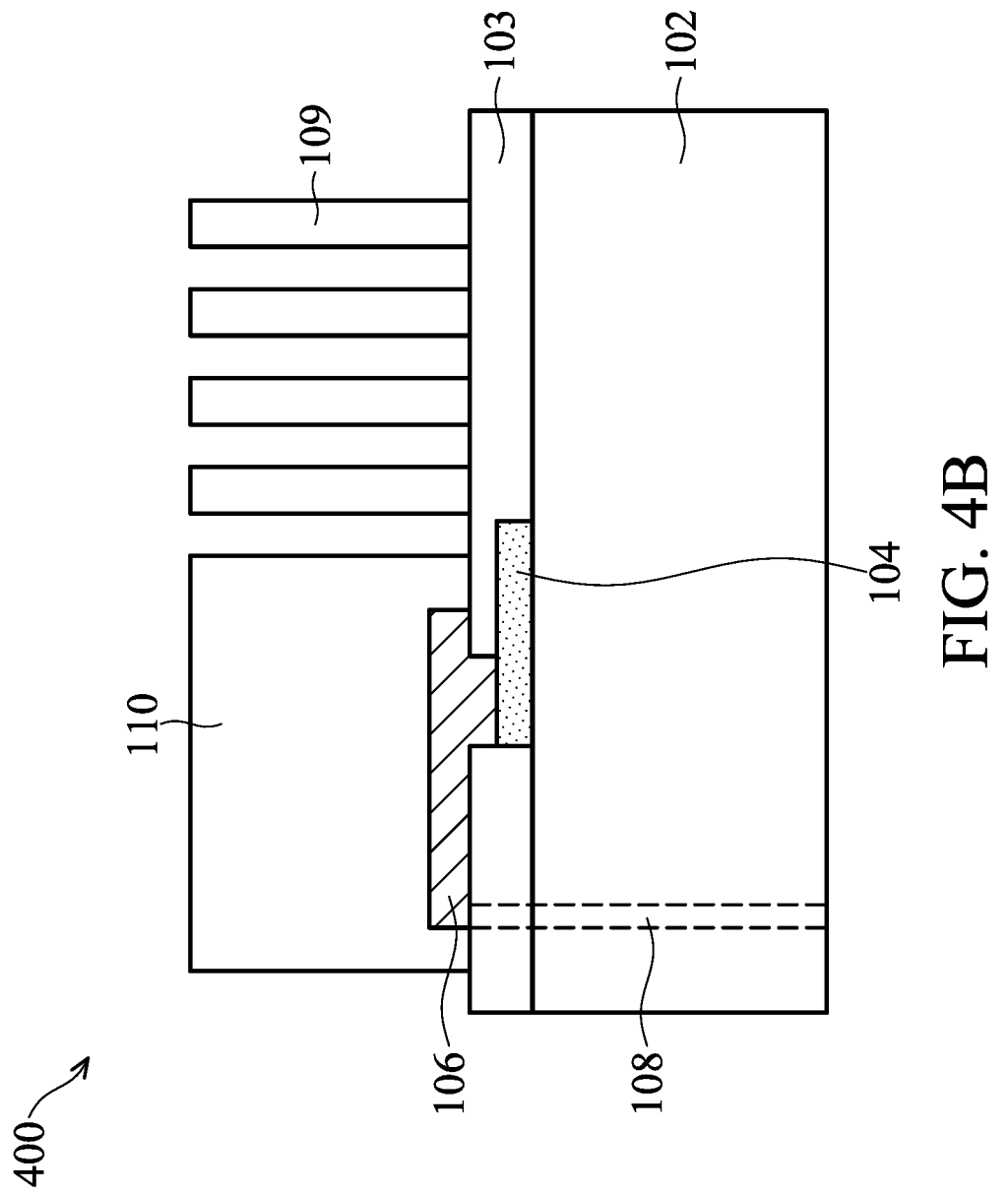

Then, as illustrated in FIG. 4B, a transparent structure is formed over the substrate 102, in accordance with some embodiments, wherein the transparent structure includes a plurality of transparent collimating pillars 109 and the bulk portion 110. Examples of the material and formation of the transparent collimating pillar 109 and the material and formation of the bulk portion 110 are as described above and will not be described again.

As illustrated in FIG. 4B, the bulk portion 110 covers the top surface and both sidewalls of the protective layer 106, but the present disclosure is not limited thereto. For example, in some embodiments, the bottom surface of the bulk portion 110 may be smaller than or substantially equal to the top surface of the protective layer 106 so that the bulk portion 110 can only cover a portion of the top surface of the protective layer 106 without coming into contact with both sidewalls of protective layer 106. Alternatively, in other embodiments, a bulk portion 110 may not be formed, which leaves the protective layer 106 exposed.

Figure 4C:
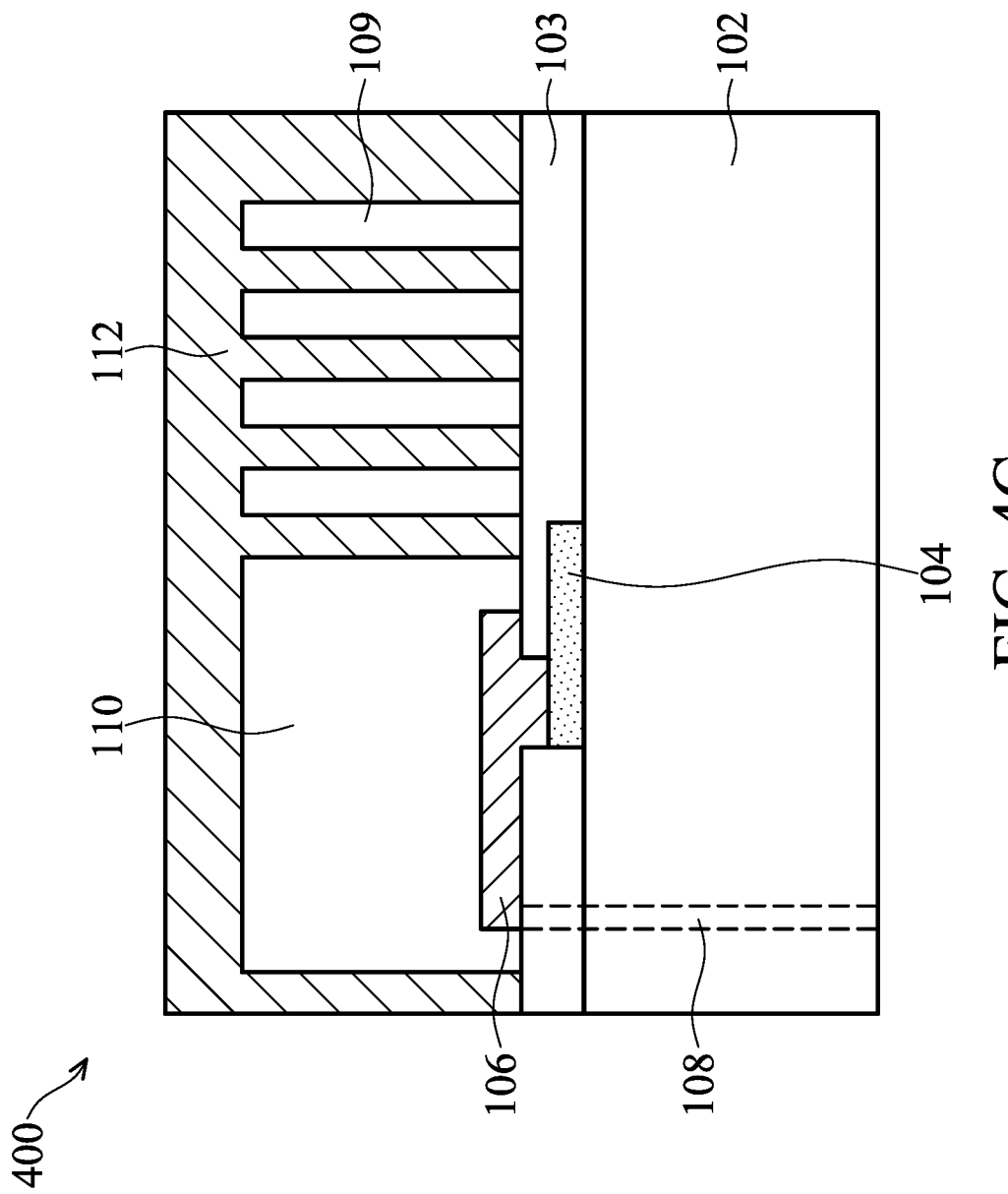

Then, as illustrated in FIG. 4C, the light-shielding structure 112 is formed over the transparent collimating pillars 109 and the bulk portion 110, wherein the light-shielding structure 112 is formed between the transparent collimating pillars 109 and between the bulk portion 110 and the transparent collimating pillars 109. Examples of the material and formation of the light-shielding structure 112 are as described above, and will not be described again. In the embodiments in which the bulk portion 110 is not formed, the light-shielding structure 112 is formed over the transparent collimating pillars 109 and the protective layer 106, and the light-shielding structure 112 is in direct contact with the protective layer 106.

Figure 4D:
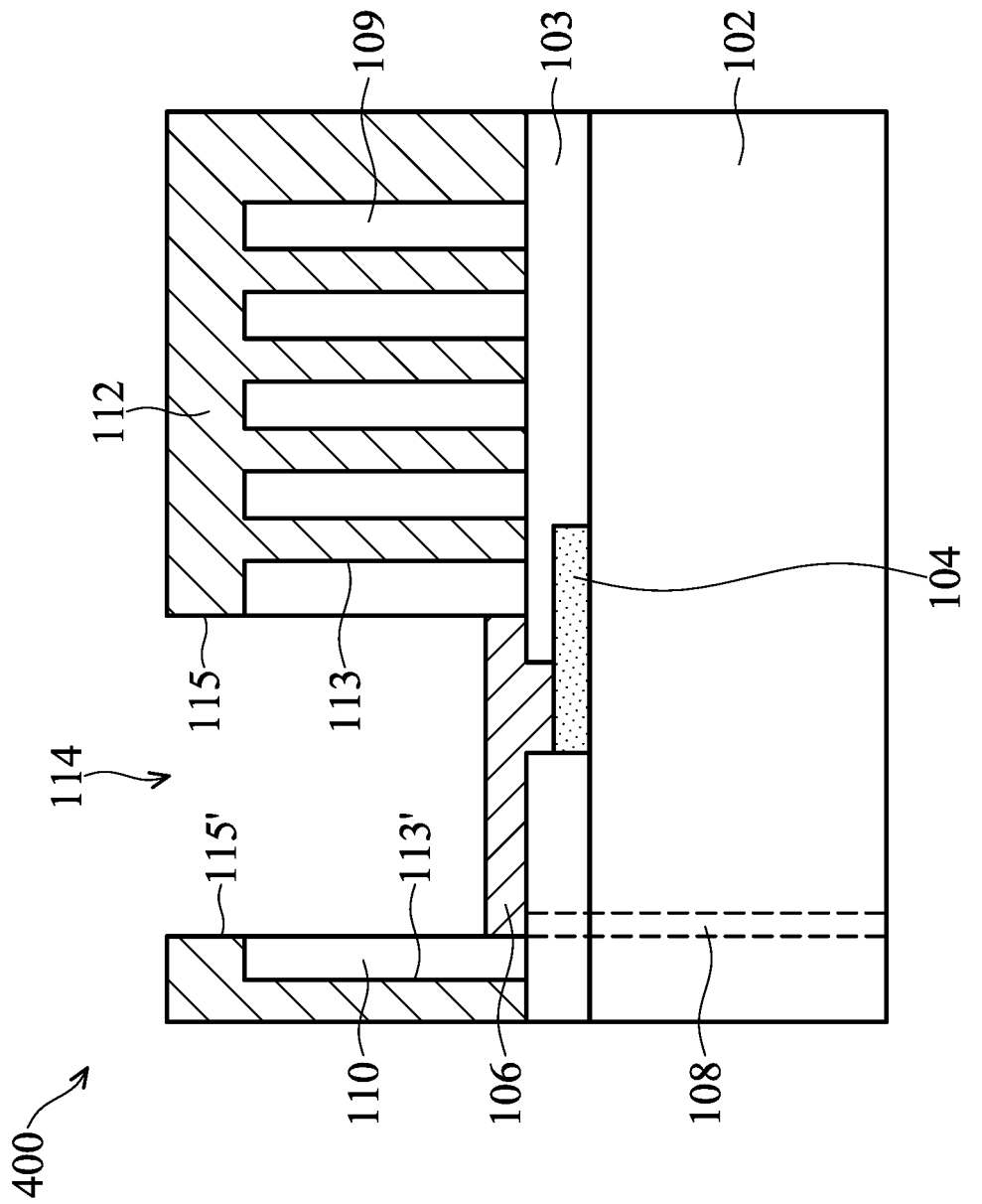

Then, as illustrated in FIG. 4D, a cutting process is performed to remove a portion of the light-shielding structure 112 and a portion of the bulk portion 110 directly above the conductive pad 104 to form the opening 114 and leave the protective layer 106 covering the conductive pad 104. Examples of the cutting process are as described above, and will not be described again.

In FIG. 4D, the sidewall of the opening 114 is substantially aligned with the sidewall of the protective layer 106 so that the bottom surface area of the opening 114 is substantially equal to the top surface area of the protective layer 106, but the present disclosure is not limited thereto. For example, the sidewall of the opening 114 may be substantially aligned with the sidewall of the bulk portion 110 or between the sidewall of the bulk portion 110 and the sidewall of the protective layer 106.

As illustrated in FIG. 4D, the light-shielding structure 112 has a stepped sidewall adjacent to the conductive pad 104, wherein the stepped sidewall has upper sidewalls 115 and 115' away from the substrate 102, and has lower sidewalls 113 and 113' adjacent to the substrate 102, and the distance between the upper sidewall 115 of the stepped sidewall and one of the transparent collimating pillars 109 is greater than the distance between the lower sidewall 113 of the stepped sidewall and the transparent collimating pillar 109. The cutting process may be adjusted to form sidewalls having different shapes.

Figure 4E:
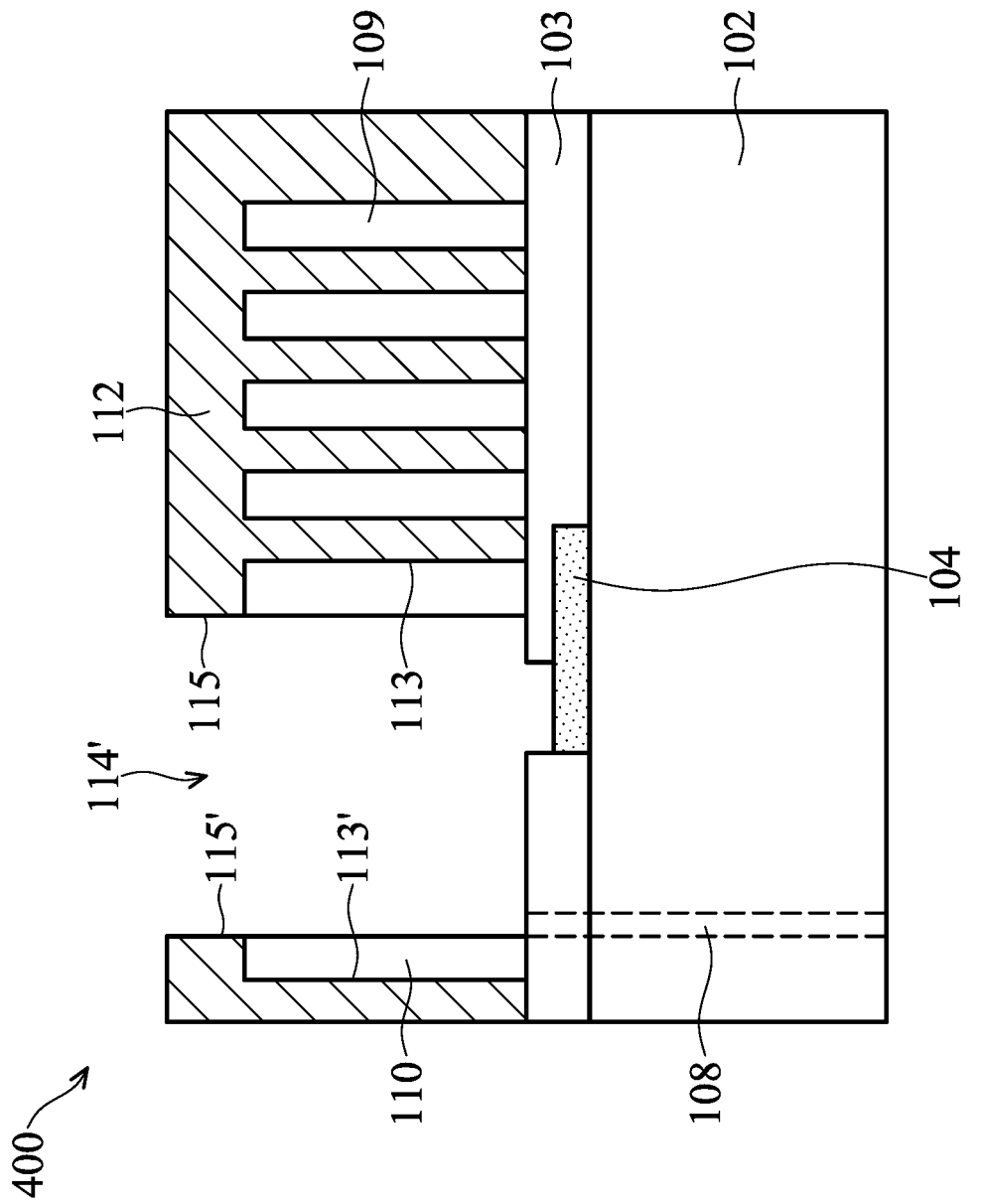

Then, as illustrated in FIG. 4E, an etching process is performed to remove the protective layer 106, and an opening 114' is formed to expose the conductive pad 104, in accordance with some embodiments. In some embodiments, the etching process may include a dry etching process, a wet etching process, or a combination thereof. For example, the dry etching process may include RIE, ICP etching, NBE, ERC etching, the like, or a combination thereof. For example, the wet etching process may use, for example, HF, $NH_4OH$, any suitable etchant, or a combination thereof. In some embodiments, the protective layer 106 includes an epoxy resin which may be etched by a wet etching process.

In some embodiments, the etching process removes only the protective layer 106 without removing the remaining portion of the bulk portion 110, but the present disclosure is not limited thereto. In other embodiments, the remaining portion of the bulk portion 110 may be removed before, during, or after removing the protective layer 106 by another etching process or by the etching process that removes the protective layer 106.

According to some embodiments, as illustrated in FIG. 4E, the opening 114' exposes the scribe line 108 to accurately perform a dicing process along the scribe line 108 to increase the yield of the semiconductor device 400.

In the above embodiment, the protective layer 106, the bulk portion 110 and the light-shielding material 112 over the protective layer 106 are disposed over the conductive pad 104, and then a cutting process is performed on the bulk portion 110 and the light-shielding material 112, and an etching process is performed on the protective layer 106. The cutting process can quickly remove a portion of the bulk portion 110 and a portion of the light-shielding material 112, and the protective layer 106 can protect the conductive pad 104 from being damaged during the cutting process. The etching process can remove the protective layer 106 without damaging the surface of the conductive pad 104.

In addition, the protective layer 106 may include a material that is easily removed to reduce the time required for the etching process. In addition, the protective layer 106 may include a material having a different etching selectivity than the surrounding material to reduce damage to the surrounding material by the etching process and to improve the yield of the semiconductor device 400.

In summary, the present disclosure performs a cutting process and an etching process on a material directly above a conductive pad to expose the conductive pad, wherein the cutting process can quickly remove most of the material and leave the remaining material covering the conductive pad to avoid the conductive pad being damaged by the cutting process. Then, the remaining material is removed by an etching process that effectively removes the remaining material without damaging the conductive pad. Therefore, the present disclosure can improve the quality of the conductive pad, thereby improving the yield of the semiconductor device.

In addition, some embodiments of the present disclosure select a material that covers the conductive pad and adjust its thickness so that the material covering the conductive pad can effectively protect the conductive pad while not causing the etching process to take too much time.

While the present disclosure has been described above by various embodiments, these embodiments are not intended to limit the disclosure. Those skilled in the art should appreciate that they may make various changes, substitutions and alterations based on the embodiments of the present disclosure to realize the same purposes and/or advantages as the various embodiments described herein. Those skilled in the art should also appreciate that such design or modification practiced does not depart from the spirit and scope of the disclosure. Therefore, the scope of protection of the present disclosure is defined as the subject matter set forth in the appended claims.

What is claimed is:

1. A method for forming a semiconductor device, comprising:
    providing a substrate with a conductive pad formed thereon;
    forming a transparent structure over the substrate, wherein the transparent structure comprises a plurality of collimating pillars adjacent to the conductive pad;
    forming a light-shielding structure over the plurality of collimating pillars and the conductive pad, wherein the light-shielding structure is disposed between the plurality of collimating pillars and between the plurality of collimating pillars and the conductive pad;
    performing a cutting process to remove one or more materials directly above the conductive pad, while leaving remaining material covering the conductive pad, wherein the one or more materials comprise a portion of the light-shielding structure; and performing an etching process to remove the remaining material to expose the conductive pad.

2. The method as claimed in claim 1, wherein a thickness of the remaining material is in a range from 10 µm to 60 µm.

3. The method as claimed in claim 1, wherein the remaining material is a light-shielding structure.

4. The method as claimed in claim 1, wherein the transparent structure further comprises a bulk portion directly above the conductive pad, and removing the one or more materials further comprises removing a portion of the bulk portion.

5. The method as claimed in claim 4, wherein the remaining material is another portion of the bulk portion.

6. The method as claimed in claim 4, further comprising forming a protective layer over the conductive pad before forming the transparent structure, and after forming the transparent structure, the bulk portion of the transparent structure covers the protective layer.

7. The method as claimed in claim 6, wherein the remaining material is the protective layer.

8. The method as claimed in claim 6, wherein the substrate has a scribe line, and a sidewall of the protective layer is aligned with the scribe line.

9. The method as claimed in claim 6, wherein the bulk portion covers a top surface and a sidewall of the protective layer so that the protective layer is spaced apart from the light-shielding structure.

10. The method as claimed in claim 6, wherein the protective layer comprises wax, hydrogel, photoresist material, or a combination thereof.

11. The method as claimed in claim 4, wherein after the cutting process, the light-shielding structure has a stepped sidewall, and the stepped sidewall is adjacent to the conductive pad, and wherein the stepped sidewall has an upper sidewall and a lower sidewall.

12. The method as claimed in claim 11, wherein a distance between the upper sidewall of the stepped sidewall and one of the collimating pillars is greater than a distance between the lower sidewall of the stepped sidewall and the one of the collimating pillars.

13. The method as claimed in claim 11, wherein a distance between the upper sidewall of the stepped sidewall and one of the collimating pillars is less than a distance between the lower sidewall of the stepped sidewall and the one of the collimating pillars.

14. The method as claimed in claim 1, further comprising forming a protective layer over the conductive pad before forming the light-shielding structure, and the remaining material is the protective layer.

15. The method as claimed in claim 1, wherein the plurality of collimating pillars comprise a light-curable material, a thermoset material, or a combination thereof.

16. The method as claimed in claim 1, wherein a height of one of the plurality of collimating pillars is in a range from 10 µm to 500 µm.

17. The method as claimed in claim 11, wherein the upper sidewall of the stepped sidewall is away from the substrate and the lower sidewall of the stepped sidewall is adjacent to the substrate.

18. The method as claimed in claim 11, wherein a length of the lower sidewall of the stepped sidewall is less than a height of one of the plurality of collimating pillars.

19. The method as claimed in claim 11, wherein the substrate has a scribe line, and the lower sidewall of the stepped sidewall is aligned with the scribe line.

* * * * *